United States Patent
Kim et al.

(10) Patent No.: US 10,978,119 B2
(45) Date of Patent: Apr. 13, 2021

(54) MEMORY DEVICE AND METHOD OF OPERATING THE SAME

(71) Applicant: SK hynix Inc., Gyeonggi-do (KR)

(72) Inventors: Heon Ki Kim, Gyeonggi-do (KR); Sung Hwa Ok, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/773,643

(22) Filed: Jan. 27, 2020

(65) Prior Publication Data

US 2021/0005233 A1 Jan. 7, 2021

(30) Foreign Application Priority Data

Jul. 2, 2019 (KR) .................. 10-2019-0079650

(51) Int. Cl.
*G11C 7/22* (2006.01)
*G11C 7/10* (2006.01)

(52) U.S. Cl.
CPC ............ *G11C 7/222* (2013.01); *G11C 7/1063* (2013.01); *G11C 7/1069* (2013.01); *G11C 7/1087* (2013.01)

(58) Field of Classification Search
CPC ......... G11C 7/222; G11C 7/1063; G11C 8/06; G11C 7/1069; G11C 7/1087
See application file for complete search history.

(56) References Cited

U.S. PATENT DOCUMENTS

| 8,098,313 | B2* | 1/2012 | Asahi | ..................... H04N 5/335 348/308 |
| 2017/0345480 | A1* | 11/2017 | Chen | ..................... G11C 11/406 |

FOREIGN PATENT DOCUMENTS

| KR | 10-2016-0075094 | 6/2016 |
| KR | 10-2018-0106491 | 10/2018 |

* cited by examiner

*Primary Examiner* — Han Yang
(74) *Attorney, Agent, or Firm* — IP & T Group LLP

(57) ABSTRACT

The present technology relates to a memory device that generates various signals used in a read training operation and a method of operating the memory device. The memory device according to an embodiment of the present disclosure includes an address counter configured to generate a plurality of count signals based on a read training enable signal and a first clock signal received from a memory controller, and an address section identification signal generator configured to generate address section identification signals used in identifying a plurality of address sections based on at least one of the plurality of count signals.

33 Claims, 12 Drawing Sheets

MEMORY DEVICE AND METHOD OF OPERATING THE SAME

CROSS-REFERENCE TO RELATED APPLICATION

The present application claims priority under 35 U.S.C. § 119(a) to Korean patent application number 10-2019-0079650, filed on Jul. 2, 2019, which is incorporated herein by reference in its entirety.

BACKGROUND

Field of Invention

The present disclosure relates to a memory device and a method of operating the same, and more particularly, to a memory device that performs a read training operation and a method of operating the same.

Description of Related Art

A memory system may include a memory device and a memory controller.

The memory controller may control an operation of a memory system in response to a request from a host. The memory device may store data or output stored data under control of the memory controller. For example, the memory device may be a volatile memory device in which stored data is lost when power supply is cut off, or a non-volatile memory device in which stored data is maintained even when power supply is cut off.

SUMMARY

Embodiments of the present disclosure provide a memory device that generates various signals used in a read training operation and a method of operating the memory device.

A memory device according to an embodiment of the present disclosure includes an address counter configured to generate a plurality of count signals based on a read training enable signal and a first clock signal received from a memory controller, and an address section identification signal generator configured to generate address section identification signals used in identifying a plurality of address sections based on at least one of the plurality of count signals.

A method of operating a memory device according to an embodiment of the present disclosure includes generating a plurality of count signals based on a read training enable signal and a first clock signal received from a memory controller, and generating address section identification signals used in identifying a plurality of address sections based on at least one of the plurality of count signals.

According to the present technology, a size of the memory device may be reduced by reducing the number of circuits generating various signals used in a read training operation, and influence of skew due to process, voltage, and temperature (PVT) may be reduced by reducing a length of a path through which the various signals are output.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Figure 1:
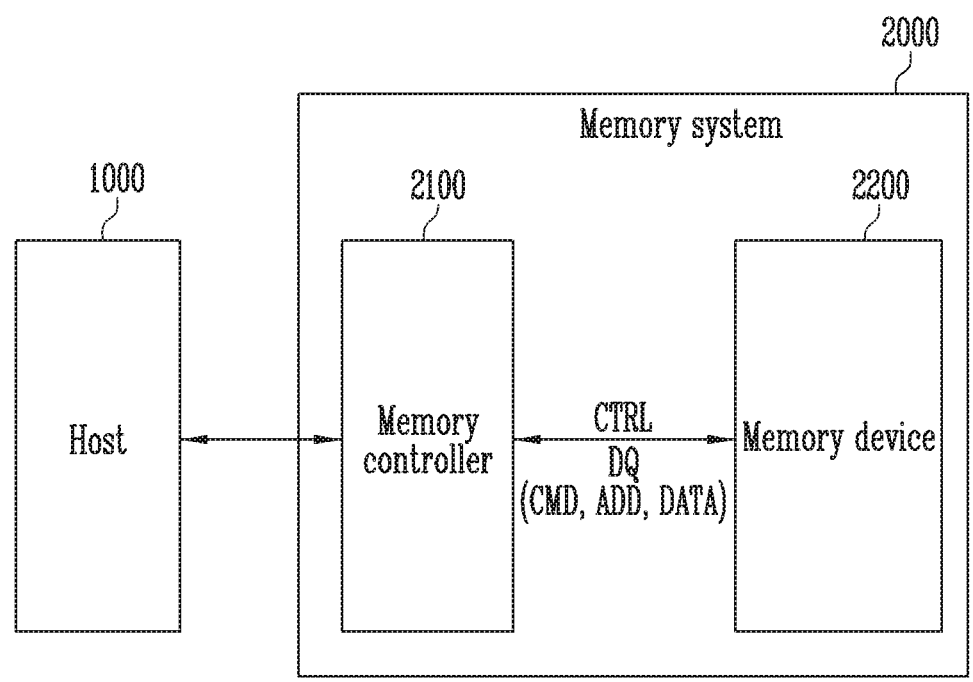
FIG. 1 is a block diagram illustrating a memory system according to an embodiment of the present disclosure.

FIG. 1 is a block diagram illustrating a memory system 2000 according to an embodiment of the present disclosure.

Referring to FIG. 1, the memory system 2000 may include a memory device 2200 in which data is stored, and a memory controller 2100 that controls the memory device 2200 according to a request from a host 1000.

The host 1000 may be a device or a system that stores data in the memory system 2000 or retrieves data from the memory system 2000. For example, the host 1000 may include at least one of a computer, a portable digital device, a tablet, a digital camera, a digital audio player, a television, a wireless communication device, or a cellular phone, however, embodiments of the present disclosure are not limited thereto.

The memory controller 2100 may control overall operations of the memory system 2000. The memory controller 2100 may perform various operations according to the request from the host 1000. For example, the memory controller 2100 may control the memory device 2200 to perform a program operation, a read operation, an erase operation, and the like according to the request from the host 1000.

The memory controller 2100 may transmit a control signal CTRL and data signals DQ to the memory device 2200 to control an operation of the memory device 2200.

The control signal CTRL and the data signals DQ may be transmitted to the memory device 2200 through different input/output lines.

The data signals DQ may include a command CMD, an address ADD, and data DATA.

The control signal CTRL may be used in distinguishing a section in which the data signals DQ are input. The control signal CTRL may include a command latch enable signal (CLE of FIG. 3), an address latch enable signal (ALE of FIG. 3), and a first clock signal (WE_N of FIG. 3).

The command latch enable signal CLE may be a signal indicating a section in which the command CMD of the data signals DQ is input.

The address latch enable signal ALE may be a signal indicating a section in which the address ADD of the data signals DQ is input.

The first clock signal WE_N may be a reference clock used in generating various clock signals for an internal operation of the memory device 2200.

The memory device 2200 may perform the program operation, the read operation, the erase operation, and the like under control of the memory controller 2100. The memory device 2200 may be a volatile memory device in which stored data is lost when power supply is cut off, or a non-volatile memory device in which stored data is maintained even when power supply is cut off.

In an embodiment, the memory controller 2100 may control the memory device 2200 to perform a read training operation, and the memory device 2200 may perform the read training operation under the control of the memory controller 2100.

The data signals DQ are required to be correctly transmitted to the memory device 2200 from the memory controller 2100 so that the memory system 2000 stably operates. The memory controller 2100 may output the data signals DQ, which are to be transmitted to the memory device 2200, in synchronization with at least one of a rising edge or a falling edge of the first clock signal WE_N output from the memory controller 2100. The memory device 2200 may convert the first clock signal WE_N to generate an internal clock signal, and read the data signals DQ in synchronization with at least one of the rising edge or the falling edge of the generated internal clock signal.

An interface training operation may be performed to stably transfer the data signals DQ between the memory controller 2100 and the memory device 2200. The interface training operation means training for optimizing an interface for transferring the data signals DQ before a normal operation between the memory controller 2100 and the memory device 2200 is performed.

The interface training operation includes an address training operation, a clock alignment training operation, a read training operation, a write training operation, and the like.

The read training operation includes a process in which the memory controller 2100 transmits addresses to the memory device 2200 together with a command for the read training operation, and then receives a read training pattern from the memory device 2200.

At this time, the memory device 2200 may generate the read training pattern based on the addresses received from the memory controller 2100 and transmit the read training pattern to the memory controller 2100. The memory device 2200 may perform the read training operation using the read training pattern. The read training operation may be an operation of adjusting a margin, such as a data input/output time, a clock, and the like, between the memory controller 2100 and the memory device 2200 before a normal read operation is performed. After the read training operation is completed, the normal read operation may be performed.

Figure 2:
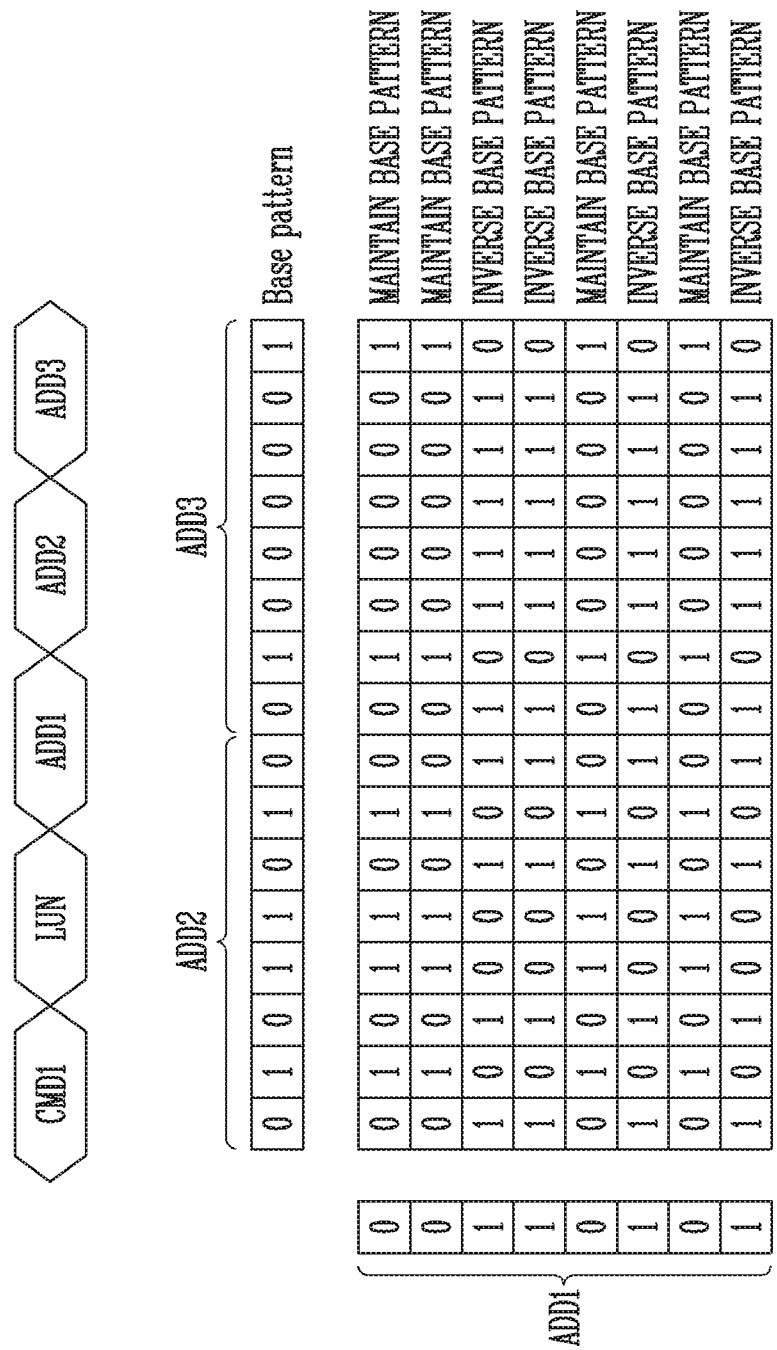
FIG. 2 is a diagram for describing a process of generating a read training pattern during a read training operation.

FIG. 2 is a diagram for describing a process of generating a read training pattern during a read training operation.

During the read training operation, a memory device may generate a read training pattern to be used in the read training operation according to a command CMD1 for the read training operation, which is received from a memory controller.

A logical unit number (LUN) among addresses LUN and ADD1 to ADD3 received together with the command CMD1 may be used in selecting any one of a plurality of logical units included in the memory device. Here, the logical unit may mean a minimum unit capable of independently executing a command.

Additionally, the addresses ADD1 to ADD3 among the addresses LUN and ADD1 to ADD3 received together with the command CMD1 may be used in generating the read training pattern.

When generating the read training pattern, the address ADD1 may be used as an inverse flag pattern. For example, bits of '1' included in the address ADD1 may indicate to generate the read training pattern by inverting a base pattern, and bits of '0' may indicate to generate the read training pattern by maintaining the base pattern. The base pattern may be generated by combining the address ADD2 with the address ADD3.

In order to generate the read training pattern, an address section identification signal used in distinguishing the address ADD1 from the remaining addresses ADD2 and ADD3 is required.

During the generation of the address section identification signal, as a length of a path between circuits for generating the address section identification signal becomes longer, variation due to process, voltage, and temperature (PVT) skew increases. Therefore, a method of generating the address section identification signal through an optimal path is required.

Figure 3:
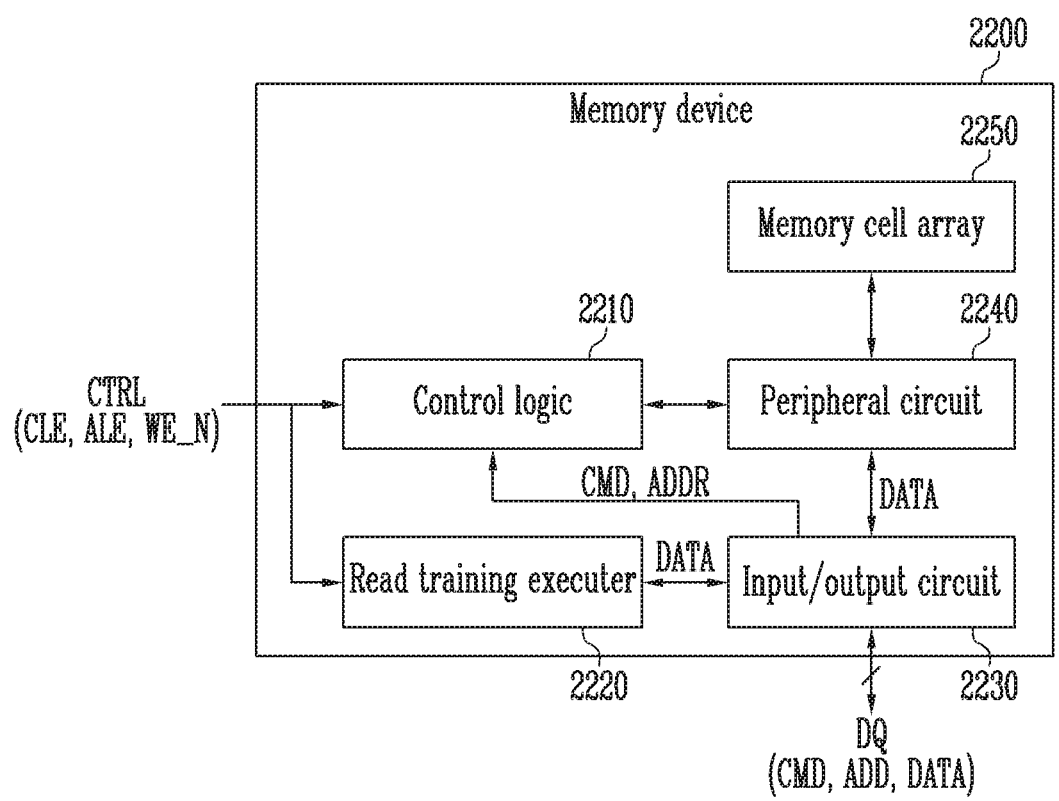
FIG. 3 is a block diagram illustrating a memory device according to an embodiment of the present disclosure.

FIG. 3 is a block diagram illustrating a memory device according to an embodiment of the present disclosure. The memory device of FIG. 3 will be described based on the memory device 2200 of FIG. 1.

The memory device 2200 may include a control logic 2210, a read training executer 2220, an input/output circuit 2230, a peripheral circuit 2240, and a memory cell array 2250.

The control logic 2210 may control the peripheral circuit 2240 in response to a control signal CTRL received from a memory controller (2100 of FIG. 1) through input/output lines, and a command CMD and an address ADD received from the memory controller 2100 through the input/output circuit 2230.

The read training executer 2220 may perform a read training operation according to the control signal CTRL received from the memory controller 2100 through the input/output lines, and the command CMD and the address ADD received from the memory controller 2100 through the input/output circuit 2230.

The input/output circuit 2230 may transmit the command CMD and the address ADD received from the memory controller 2100 through the input/output lines to the control logic 2210 or the read training executer 2220. The input/output circuit 2230 may exchange data DATA with the peripheral circuit 2240 and the read training executer 2220.

The peripheral circuit 2240 may perform a program operation, a read operation, an erase operation, and the like on memory cells included in the memory cell array 2250 according to control of the control logic 2210.

Figure 4:
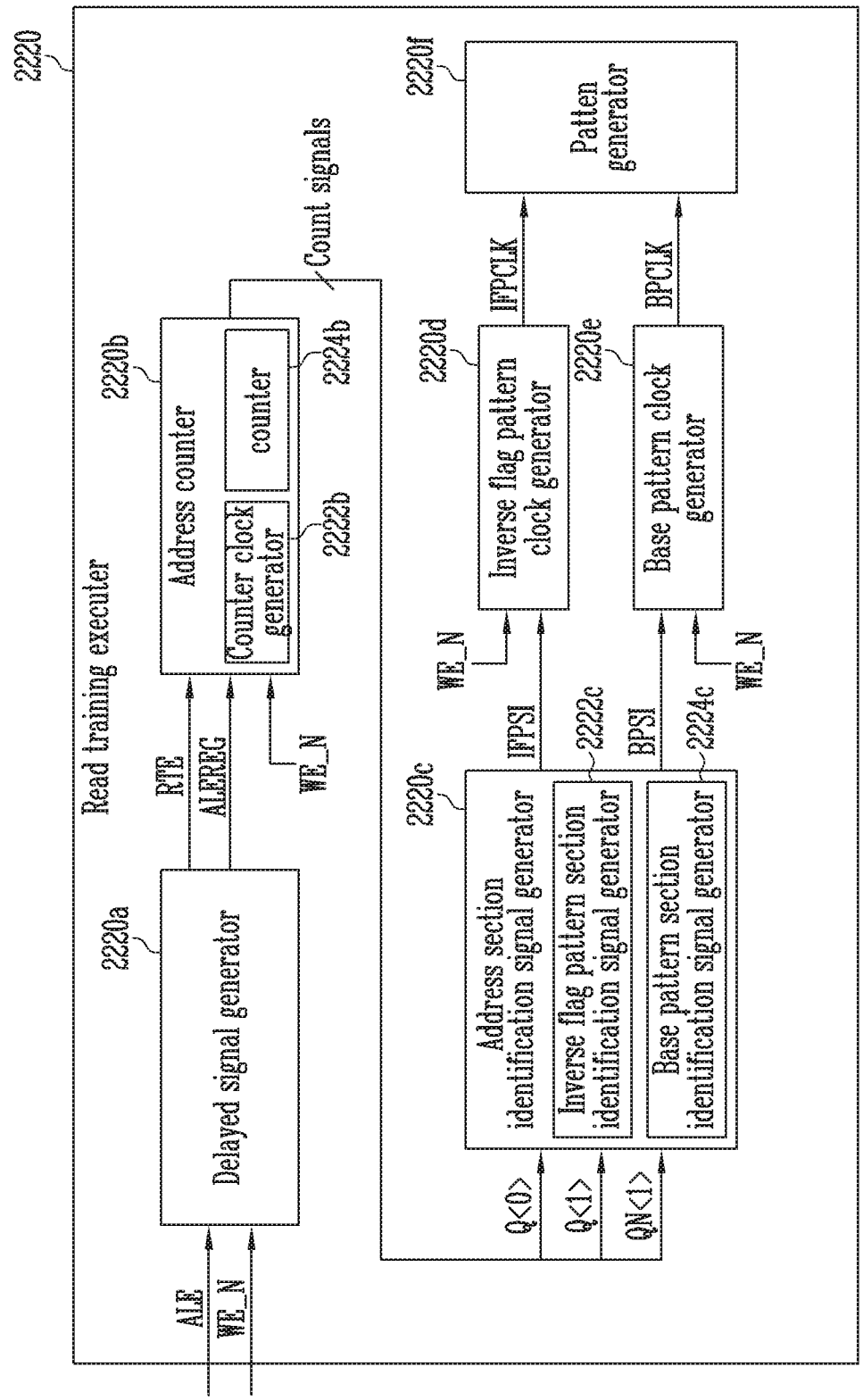
FIG. 4 is a block diagram illustrating a read training executor according to an embodiment of the present disclosure.

FIG. 4 is a block diagram illustrating a read training executer according to an embodiment of the present disclosure. The read training executer of FIG. 4 will be described based on the read training executer 2220 of FIG. 3.

The read training executer 2220 may include a delayed signal generator 2220*a*, an address counter 2220*b*, an address section identification signal generator 2220*c*, an inverse flag pattern clock generator 2220*d*, a base pattern clock generator 2220*e*, and a pattern generator 2220*f*.

The delayed signal generator 2220*a* may receive an address latch enable signal ALE and a first clock signal WE_N from a memory controller, and may generate and output a delayed signal ALEREG and a read training enable signal RTE. The delayed signal ALEREG may be generated by delaying the address latch enable signal ALE by a set time.

The address counter 2220*b* may receive the read training enable signal RTE and the delayed signal ALEREG received from the delayed signal generator 2220*a* and the first clock signal WE_N received from the memory controller, and may output count signals. The address counter 2220*b* may include a counter clock generator 2222*b* and a counter 2224*b*. The counter clock generator 2222*b* may generate a clock signal (hereinafter, referred to as a second clock signal) used by the counter 2224*b* to generate the count signals. The counter 2224*b* may generate the count signals according to the second clock signal. An example of the address counter 2220*b* will be described later with reference to FIG. 5.

The address section identification signal generator 2220*c* may generate address section identification signals based on at least one of the count signals received from the address counter 2220*b*. For example, the address section identification signal generator 2220*c* may generate the address section identification signals based on at least one of the count signal Q<0>, Q<1>, and QN<1>. The address section identification signal generator 2220*c* may include an inverse flag pattern section identification signal generator 2222*c* and a base pattern section identification signal generator 2224*c*.

The inverse flag pattern section identification signal generator 2222*c* may generate an inverse flag pattern section identification signal IFPSI used in identifying a first address section in which an address (for example, ADD1) corresponding to an inverse flag pattern among addresses (for example, ADD1 to ADD3 of FIG. 2), is received from the memory controller, and may output the inverse flag pattern section identification signal IFPSI to the inverse flag pattern clock generator 2220*d*.

The base pattern section identification signal generator 2224*c* may generate a base pattern section identification signal BPSI used in identifying a second address section in which addresses (for example, ADD2 and ADD3) corresponding to a base pattern among the addresses (for example, ADD1 to ADD3 of FIG. 2), are received from the memory controller, and may output the base pattern section identification signal BPSI to the base pattern clock generator 2220*e*.

An example of the address section identification signal generator 2220*c* will be described below with reference to FIG. 7.

The inverse flag pattern clock generator 2220*d* may generate an inverse flag pattern clock signal IFPCLK based on the first clock signal WE_N and the inverse flag pattern section identification signal IFPSI received from the address section identification signal generator 2220*c*, and may output the inverse flag pattern clock signal IFPCLK to the pattern generator 2220*f*. The inverse flag pattern clock signal IFPCLK may be used in latching the address ADD1 corresponding to an inverse flag pattern. An example of the inverse flag pattern clock generator 2220*d* will be described below with reference to FIG. 9.

The base pattern clock generator 2220*e* may generate a base pattern clock signal BPCLK based on the first clock signal WEN and the base pattern section identification signal BPSI received from the address section identification signal generator 2220*c*, and may output the base pattern clock signal BPCLK to the pattern generator 2220*f*. The base pattern clock signal BPCLK may be used in latching each of the addresses ADD2 and ADD3 corresponding to a base pattern. An example of the base pattern clock generator 2220*e* will be described below with reference to FIG. 10.

The pattern generator 2220*f* may generate a read training pattern using the inverse flag pattern clock signal IFPCLK received from the inverse flag pattern clock generator 2220*d* and the base pattern clock signal BPCLK received from the base pattern clock generator 2220*e*.

In an embodiment, the pattern generator 2220*f* may generate the inverse flag pattern by latching the address ADD1 according to the inverse flag pattern clock signal IFPCLK. For example, the pattern generator 2220*f* may latch the address ADD1 at a rising edge of the inverse flag pattern clock signal IFPCLK and generate the latched address ADD1 as the inverse flag pattern.

In an embodiment, the pattern generator 2220*f* may generate the base pattern by latching the addresses ADD2 and ADD3 according to the base pattern clock signal BPCLK. For example, the pattern generator 2220*f* may latch the address ADD2 at a first rising edge of the base pattern clock signal BPCLK, and may latch the address ADD3 at a second rising edge of the base pattern clock signal BPCLK. The pattern generator 2220*f* may generate the base pattern by combining the latched addresses ADD2 and ADD3 with each other.

Figure 5:
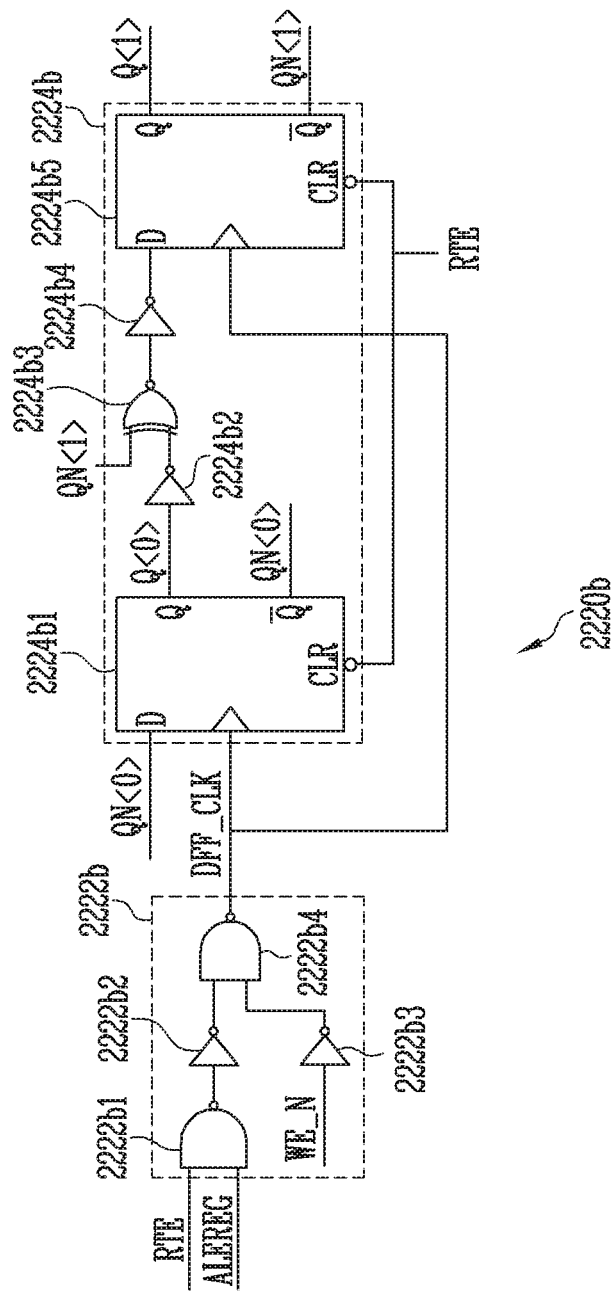
FIG. 5 is a circuit diagram illustrating an address counter according to an embodiment of the present disclosure.

FIG. 5 is a circuit diagram illustrating an address counter according to an embodiment of the present disclosure. The address counter of FIG. 5 will be described based on the address counter 2220*b* of FIG. 4.

The address counter 2220*b* may include a counter clock generator 2222*b* and a counter 2224*b*.

The counter clock generator 2222*b* may generate a second clock signal DFF_CLK to be used by the counter 2224*b*. The counter clock generator 2222*b* may generate the second clock signal DFF_CLK based on a read training enable signal RTE, a delayed signal ALEREG, and a first clock signal WE_N. The counter clock generator 2222*b* may include a first NAND gate 2222*b*1, a first inverter 2222*b*2, a second inverter 2222*b*3, and a second NAND gate 2222*b*4.

The first NAND gate 2222*b*1 may perform a logic NAND operation on the read training enable signal RTE and the delayed signal ALEREG, and output a signal to the first inverter 2222*b*2.

The first inverter 2222*b*2 may invert and output the signal received from the first NAND gate 2222*b*1.

The second inverter 2222*b*3 may invert and output the first clock signal WE_N.

The second NAND gate 2222*b*4 may perform a logic NAND operation on signals received from the first inverter 2222*b*2 and the second inverter 2222*b*3 to generate the second clock signal DFF_CLK, and may output the generated second clock signal DFF_CLK to the counter 2224*b*. As a result, the counter clock generator 2222*b* may invert and output the first clock signal WE_N as the second clock signal DFF_CLK when the delayed signal ALEREG and the read training enable signal RTE become logic high levels.

The counter 2224b may include a first count signal generator 2224b1, a third inverter 2224b2, a first XNOR gate 2224B3, a fourth inverter 2224b4, and a second count signal generator 2224b5. In FIG. 5, an example in which the first count signal generator 2224b1 and the second count signal generator 2224b5 are implemented as a D flip-flop is shown, but embodiments of the present disclosure are not limited thereto. Hereinafter, the first count signal generator 2224b1 is a first D flip-flop 2224b1 and the second count signal generator 2224b5 is a second D flip-flop 2224b5.

The first D flip-flop 2224b1 and the second D flip-flop 2224b5 may generate count signals Q<0>, QN<0>, Q<1>, and QN<1> in synchronization with the second clock signal DFF_CLK received from the counter clock generator 2222b. The first D flip-flop 2224b1 and the second D flip-flop 2224b5 may be initialized according to the read training enable signal RTE. For example, when the read training enable signal RTE has a logic low level, the count signals Q<1:0> may be initialized to "00" and the count signals QN<1:0> may be initialized to "11".

The first D flip-flop 2224b1 may have a first output terminal Q to which a first signal Q<0> is output, and a second output terminal Q to which a first inverse signal QN<0> is output, and an input terminal D to which the first inverse signal QN<0> output from the second output terminal $\overline{Q}$ is fed back. The second D flip-flop 2224b5 may have a first output terminal Q to which a second signal Q<1> is output, and a second output terminal $\overline{Q}$ to which a second inverse signal QN<1> is output, and an input terminal D to which a signal output from the fourth inverter 2224b4 is input.

The first signal Q<0> output from the first output terminal Q of the first D flip-flop 2224b1 may be input to the third inverter 2224b2.

The third inverter 2224b2 may invert the first signal Q<0> received from the first output terminal Q of the first D flip-flop 2224b1, and output an inverted first signal.

The first XNOR gate 2224B3 may perform a logic XNOR operation on the inverted first signal received from the third inverter 2224b2 and the second inverse signal QN<1> received from the second terminal $\overline{Q}$ of the second D flip-flop 2224b5.

The fourth inverter 2224b4 may invert a signal received from the first XNOR gate 2224B3, and output an inverted signal. The inverted signal output from the fourth inverter 2224b4 may be input to the input terminal D of the second D flip-flop 2224b5. As a result, the counter 2224b may generate the count signals Q<0>, QN<0>, Q<1>, and QN<1> by dividing a frequency of the second clock signal DFF_CLK. That is, the count signals Q<0> and QN<0> may have a period twice a period of the second clock signal DFF_CLK, and the count signals Q<1>, and QN<1> may have a period twice the period of any of the count signals Q<0> and QN<0>.

Figure 6:
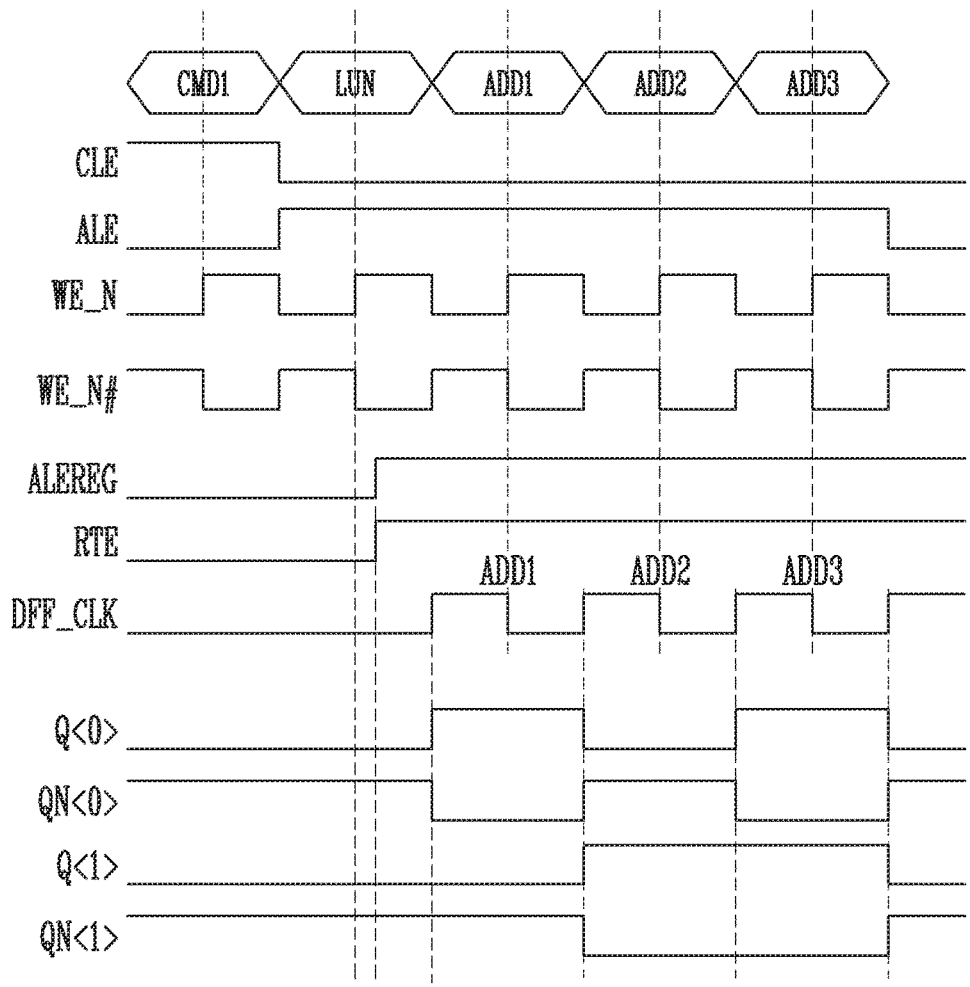
FIG. 6 is a timing diagram for describing an operation of the address counter of FIG. 5, according to an embodiment of the present disclosure.

FIG. 6 is a timing diagram for describing an operation of the address counter 2220b of FIG. 5, according to an embodiment of the present disclosure.

Referring to FIGS. 5 and 6, a command CMD may be latched at a rising edge of the first clock signal WE_N in a state in which a command latch enable signal CLE is a logic high level. Here, the command CMD may be a command for performing a read training operation.

When the command CMD is latched, the command latch enable signal CLE may transit to a logic low level, and the address latch enable signal ALE may transit to a logic high level.

An address LUN may be latched at the rising edge of the first clock signal WE_N in a state in which the address latch enable signal ALE is a logic high level. When the address LUN is latched, a delayed signal ALEREG and a read training enable signal RTE are generated to have a logic high level.

The second clock signal DFF_CLK has a rising edge at a time point when each of addresses ADD1 to ADD3 starts to be received. The second clock signal DFF_CLK may be a clock signal having the same period as the first clock signal WE_N or a first clock inverse signal WE_N # when both of the delayed signal ALEREG and the read training enable signal RTE are logic high levels. For example, the second clock signal DFF_CLK may be the same as the first clock inverse signal WE_N # in the section in which both of the delayed signal ALEREG and the read training enable signal RTE are logic high levels. The second clock signal DFF_CLK may be used to count the number of the addresses ADD1 to ADD3. The first signal Q<0> output from the first D-flip-flop may be a clock signal having a period twice the period of the second clock signal DFF_CLK. For example, the first signal Q<0> may remain a logic high level during one period in which the second clock signal DFF_CLK has a logic high level and a logic low level once, and the first signal Q<0> may maintain a logic low level for one period in which the second clock signal DFF_CLK has a logic high level and a logic low level once again. That is, the first signal Q<0> may have one period during two periods of the second clock signal DFF_CLK. The first inverse signal QN<0> output from the first D flip-flop may be a signal in which the first signal Q<0> is inverted.

The second signal Q<1> output from the second D flip-flop may maintain a logic low level during a half period of the first signal Q<0> output from the first D flip-flop. The second signal Q<1> output from the second D flip-flop may be a clock signal having a period twice the period of the first signal Q<0> output from the first D flip-flop. The second inverse signal QN<1> output from the second D flip-flop may be a signal in which the second signal Q<1> is inverted.

The first signal Q<0> and the second signal Q<1> may be used for counting the number of addresses. For example, the first signal Q<0> and the second signal Q<1> may be defined as first count signals, and the first inverse signal QN<0> and the second inverse signal QN<1> may be defined as second count signals. Further, the first signal Q<0> may be defined as a lower bit count signal corresponding to a lower bit among the first count signals Q<0> and Q<1>, and the second signal Q<1> may be defined as an upper bit count signal corresponding to a upper bit among the second count signals QN<0> and QN<1>. For example, when the second signal Q<1> and the first signal Q<0> are '01', it may indicate that one address ADD1 is input, when the second signal Q<1> and the first signal Q<0> are '10', it may indicate that two addresses ADD1 and ADD2 are input, and when the second signal Q<1> and the first signal Q<0> are '11', it may indicate that three addresses ADD1 to ADDS are input.

Figure 7:
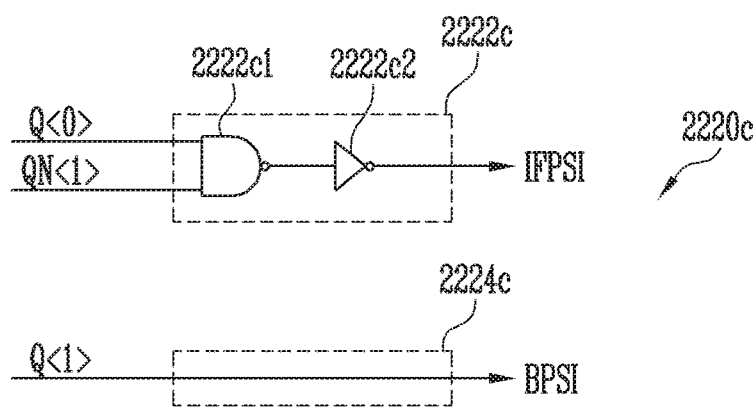
FIG. 7 is a circuit diagram illustrating an address section identification signal generator according to an embodiment of the present disclosure.

FIG. 7 is a circuit diagram illustrating an address section identification signal generator according to an embodiment of the present disclosure. The address section identification signal generator of FIG. 7 will be described based on the address section identification signal generator 2220c of FIG. 4.

The address section identification signal generator 2220c may include an inverse flag pattern section identification signal generator 2222c and a base pattern section identification signal generator 2224c.

The inverse flag pattern section identification signal generator 2222c may include a third NAND gate 2222c1 and a fifth inverter 2222c2.

The third NAND gate 2222c1 may perform a logic NAND operation on a first signal Q<0> output from a first D flip-flop 2224b1 and a second inverse signal QN<1> output from a second D flip-flop 2224b5.

The fifth inverter 2222c2 may invert a signal received from the third NAND gate 2222c1, and output an inverted signal as an inverse flag pattern section identification signal IFPSI. As a result, the inverse flag pattern section identification signal generator 2222c may output the inverse flag pattern section identification signal IFPSI to maintain a logic high level when both of the first signal Q<0> and the second inverse signal QN<1> are logic high levels.

The base pattern section identification signal generator 2224c may output a second signal Q<1> received from a first D flip-flop 2224b1 as a base pattern section identification signal BPSI.

Figure 8:
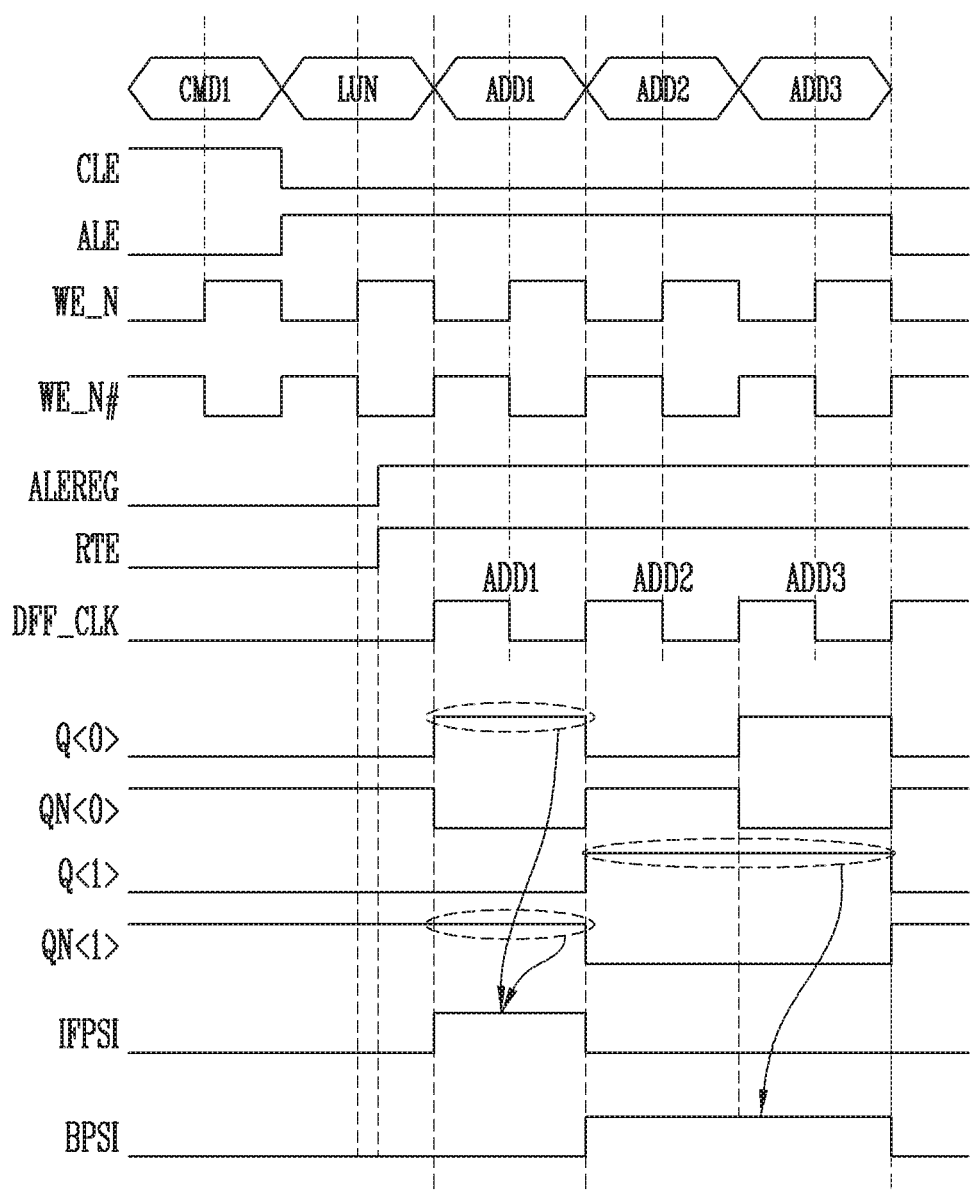
FIG. 8 is a timing diagram for describing an operation of the address section identification signal generator of FIG. 7, according to an embodiment of the present disclosure.

FIG. 8 is a timing diagram for describing signals from an operation of the address section identification signal generator of FIG. 7, according to an embodiment of the present disclosure.

Since signals except for an inverse flag pattern section identification signal IFPSI and a base pattern section identification signal BPSI are the same as the signals described with reference to FIG. 6, repetitive description thereof will be omitted.

The inverse flag pattern section identification signal IFPSI has a rising edge at a time point when the address ADD1 starts to be received and has a falling edge at a time point when the reception of the address ADD1 is ended. That is, a section in which the inverse flag pattern section identification signal IFPSI is a logic high level corresponds to a first address section in which the address ADD1 is received. Therefore, the inverse flag pattern section identification signal IFPSI may be used in identifying the first address section in which the address ADD1 is received.

The base pattern section identification signal BPSI has a rising edge at a time point when the address ADD2 starts to be received and has a falling edge at a time point when the reception of the address ADD3 is ended. That is, a section in which the base pattern section identification signal BPSI is a logic high level corresponds to a second address section in which the addresses ADD2 and ADD3 are received. Therefore, the base pattern section identification signal BPSI may be used in identifying the second address section in which the addresses ADD2 and ADD3 are received.

Figure 9:
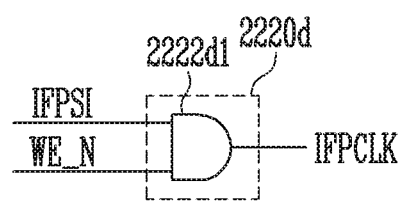
FIG. 9 is a circuit diagram illustrating an inverse flag pattern clock generator according to an embodiment of the present disclosure.

FIG. 9 is a circuit diagram illustrating an inverse flag pattern clock generator according to an embodiment of the present disclosure. The inverse flag pattern clock generator of FIG. 9 will be described based on the inverse flag pattern clock generator 2220d of FIG. 4.

The inverse flag pattern clock generator 2220d may include a first AND gate 2222d1.

The first AND gate 2222d1 may perform a logic AND operation on a first clock signal WE_N and an inverse flag pattern section identification signal IFPSI output from an address section identification signal generator 2220c, and may output an inverse flag pattern clock signal IFPCLK.

As described above, the inverse flag pattern clock signal IFPCLK may be used in latching an address ADD1 corresponding to an inverse flag pattern. For example, the address ADD1 may be latched at a rising edge of the inverse flag pattern clock signal IFPCLK, and the latched address ADD1 may be used as the inverse flag pattern.

Figure 10:
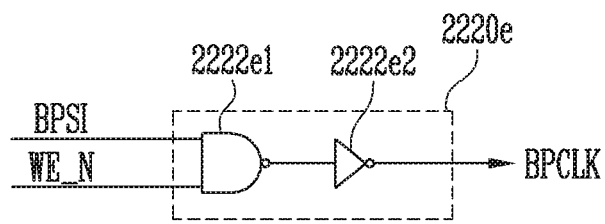
FIG. 10 is a circuit diagram illustrating a base pattern clock generator according to an embodiment of the present disclosure.

FIG. 10 is a circuit diagram illustrating a base pattern clock generator according to an embodiment of the present disclosure. The base pattern clock generator of FIG. 10 will be described based on the base pattern clock generator 2220e of FIG. 4.

The base pattern clock generator 2220e may include a fourth NAND gate 2222e1 and a sixth inverter 2222e2.

The fourth NAND gate 2222e1 may perform a logic NAND operation on a first clock signal WE_N and a base pattern section identification signal BPSI output from an address section identification signal generator 2220c. According to an embodiment, a second signal Q<1> output from the second D flip-flop 2224b5 instead of the base pattern section identification signal BPSI output from the address section identification signal generator 2220c may be input to the fourth NAND gate 2222e1.

The sixth inverter 2222e2 may invert a signal received from the fourth NAND gate 2222e1, and output an inverse signal as a base pattern clock signal BPCLK.

As described above, the base pattern clock signal BPCLK may be used in latching the addresses ADD2 and ADD3 corresponding to the base pattern. For example, the address ADD2 may be latched at a first rising edge of the base pattern clock signal BPCLK, and the address ADD3 may be latched at a second rising edge of the base pattern clock signal BPCLK. The latched addresses ADD2 and ADD3 may be combined with each other to generate the base pattern.

Figure 11:
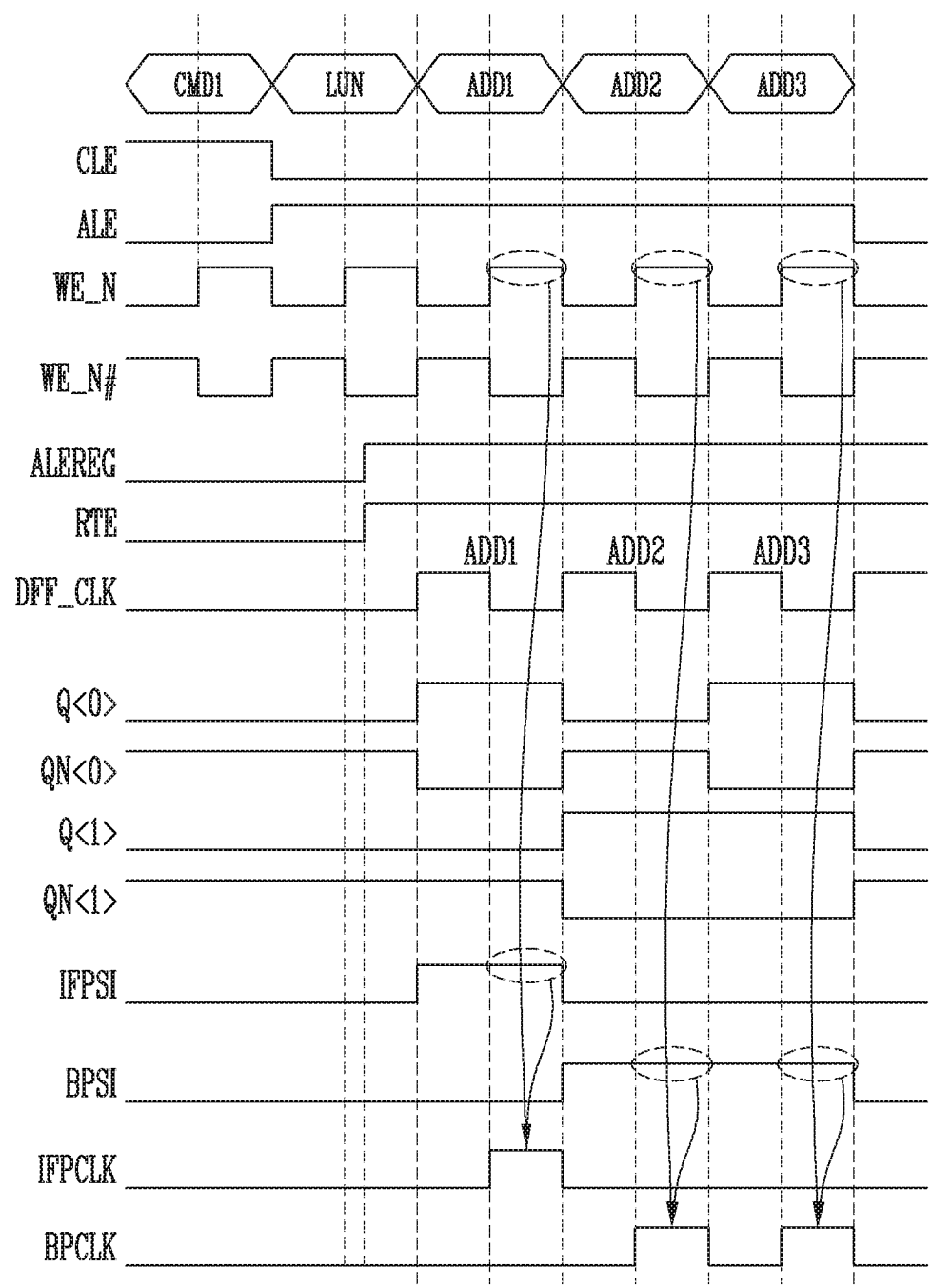
FIG. 11 is a timing diagram for describing operations of the inverse flag pattern clock signal generator and the base pattern clock signal generator of FIGS. 9 and 10, according to an embodiment of the present disclosure.

FIG. 11 is a timing diagram for describing operations of the inverse flag pattern clock signal generator and the base pattern clock signal generator of FIGS. 9 and 10, according to an embodiment of the present disclosure.

Since the remaining signals except for an inverse flag pattern clock signal IFPCLK and a base pattern clock signal BPCLK are the same as those described with reference to FIGS. 6 and 8, repetitive description thereof will be omitted.

The inverse flag pattern clock signal IFPCLK may be the same clock signal as the first clock signal WE_N in a section in which the inverse flag pattern section identification signal IFPSI is a logic high level. That is, the inverse flag pattern clock signal IFPCLK may have a rising edge at the rising edge of the first clock signal WE_N and may have a falling edge at the falling edge of the first clock signal WE_N, in a section in which the inverse flag pattern section identification signal IFPSI is a logic high level. The address ADD1 may be latched at a rising edge of the inverse flag pattern clock signal IFPCLK.

The base pattern clock signal BPCLK may be the same clock signal as the first clock signal WE_N in a section in which the base pattern section identification signal BPSI is a logic high level. That is, the base pattern clock signal BPCLK may have a rising edge at the rising edge of the first clock signal WE_N and may have a falling edge at the falling edge of the first clock signal WE_N, in a section in which the base pattern section identification signal BPSI is a logic high level. The address ADD2 may be latched at a first rising edge of the base pattern clock signal BPCLK and the address ADD3 may be latched at a second rising edge of the base pattern clock signal BPCLK.

Figure 12:
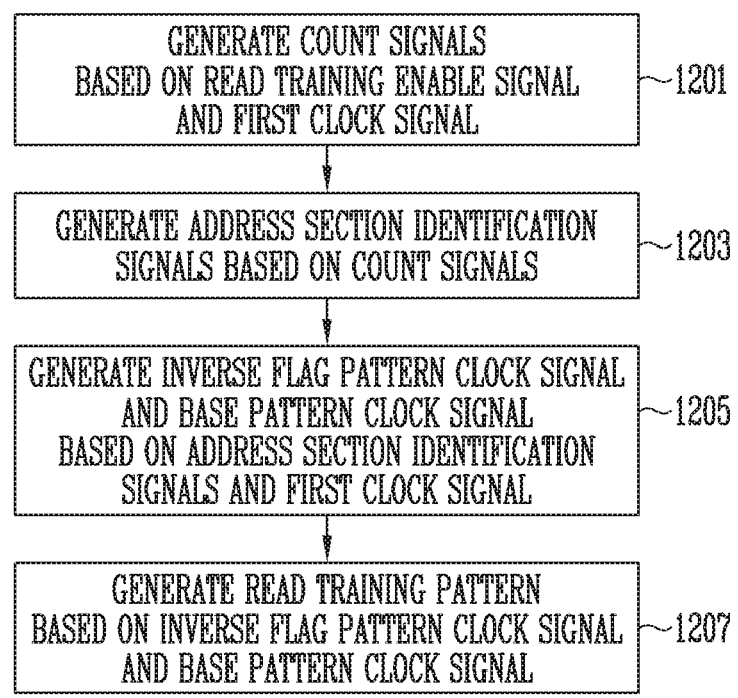
FIG. 12 is a flowchart for describing a method of operating a memory device according to an embodiment of the present disclosure.

FIG. 12 is a flowchart for describing a method of operating a memory device according to an embodiment of the present disclosure.

In step 1201, a memory device may generate count signals based on a read training enable signal RTE and a first clock signal WE_N.

In step 1203, the memory device may generate address section identification signals using the count signals. The address section identification signals may include an inverse flag pattern section identification signal IFPSI and a base pattern section identification signal BPSI.

In step 1205, the memory device may generate an inverse flag pattern clock signal IFPCLK and a base pattern clock signal BPCLK based on the address section identification signals IFPSI and BPSI and the first clock signal WE_N.

In step 1207, the memory device may generate a read training pattern based on the inverse flag pattern clock signal IFPCLK and the base pattern clock signal BPCLK.

Figure 13:
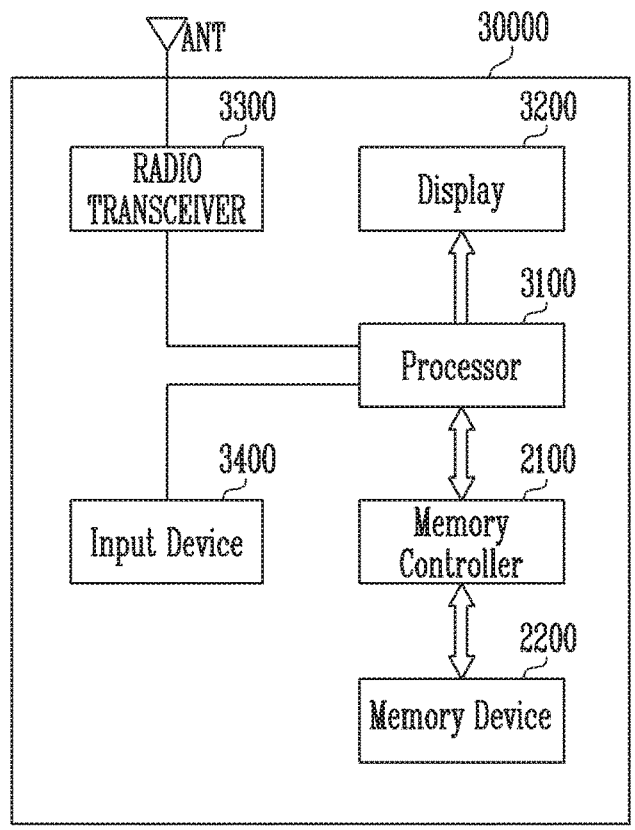
FIGS. 13 to 16 are block diagrams for describing another example of a memory system including the memory device shown in FIG. 3.

FIG. 13 is a block diagram illustrating another example of a memory system 30000 including the memory device shown in FIG. 3.

Referring to FIG. 13, the memory system 30000 may be implemented as a cellular phone, a smart phone, a tablet, a personal computer (PC), a personal digital assistant (PDA), or a wireless communication device. The memory system 30000 may include the memory device 2200 and the memory controller 2100 capable of controlling the operation of the memory device 2200.

The memory controller 2100 may control a data access operation, for example, a program operation, an erase operation, a read operation, or the like, of the memory device 2200 under control of a processor 3100.

Data programmed in the memory device 2200 may be output through a display 3200 under the control of the memory controller 2100.

A radio transceiver 3300 may transmit and receive a radio signal through an antenna ANT. For example, the radio transceiver 3300 may convert a radio signal received through the antenna ANT into a signal that may be processed by the processor 3100. Therefore, the processor 3100 may process the signal output from the radio transceiver 3300 and transmit the processed signal to the memory controller 2100 or the display 3200. The memory controller 2100 may transmit the signal processed by the processor 3100 to the memory device 2200. In addition, the radio transceiver 3300 may convert a signal output from the processor 3100 into a radio signal, and output the converted radio signal to an external device through the antenna ANT. An input device 3400 may be a device capable of inputting a control signal for controlling the operation of the processor 3100 or data to be processed by the processor 3100. The input device 3400 may be implemented as a pointing device such as a touch pad or a computer mouse, a keypad, or a keyboard. The processor 3100 may control an operation of the display 3200 so that data output from the memory controller 2100, data output from the radio transceiver 3300, or data output from the input device 3400 is output through the display 3200.

According to an embodiment, the memory controller 2100 capable of controlling the operation of memory device 2200 may be implemented as a part of the processor 3100 and may be implemented as a chip separate from the processor 3100.

Figure 14:
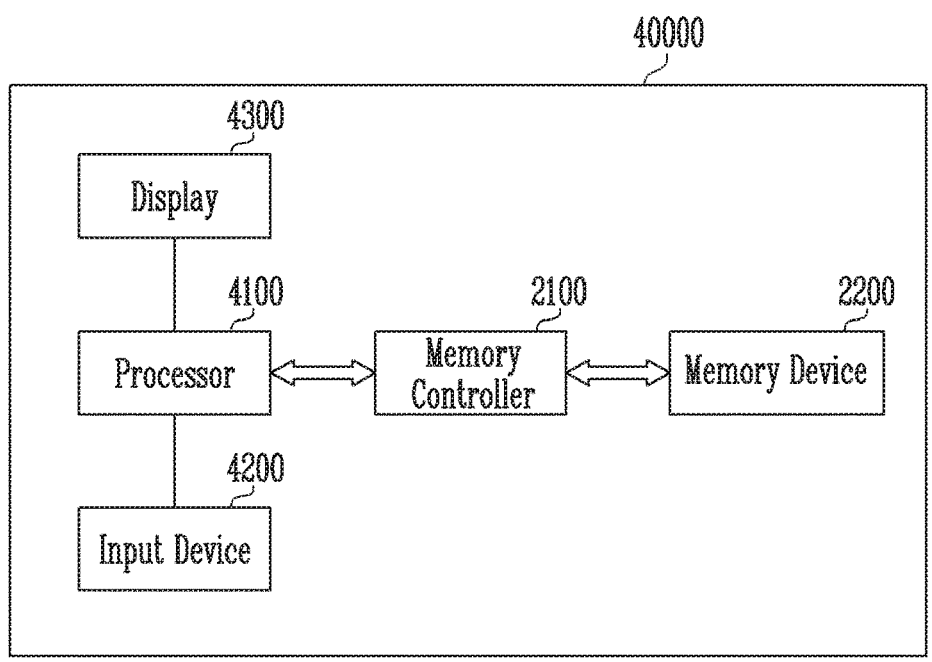

FIG. 14 is a block diagram illustrating another example of a memory system 40000 including the memory device shown in FIG. 3.

Referring to FIG. 14, the memory system 40000 may be implemented as a personal computer (PC), a tablet, a netbook, an e-reader, a personal digital assistant (PDA), a portable multimedia player (PMP), an MP3 player, or an MP4 player.

The memory system 40000 may include the memory device 2200 and the memory controller 2100 capable of controlling a data process operation of the memory device 2200.

A processor 4100 may output data stored in the memory device 2200 through a display 4300, according to data input through an input device 4200. For example, the input device 4200 may be implemented as a point device such as a touch pad, a computer mouse, a keypad, or a keyboard.

The processor 4100 may control the overall operation of the memory system 40000 and control the operation of the memory controller 2100. According to an embodiment, the memory controller 2100 capable of controlling the operation of memory device 2200 may be implemented as a part of the processor 4100 or may be implemented as a chip separate from the processor 4100.

Figure 15:
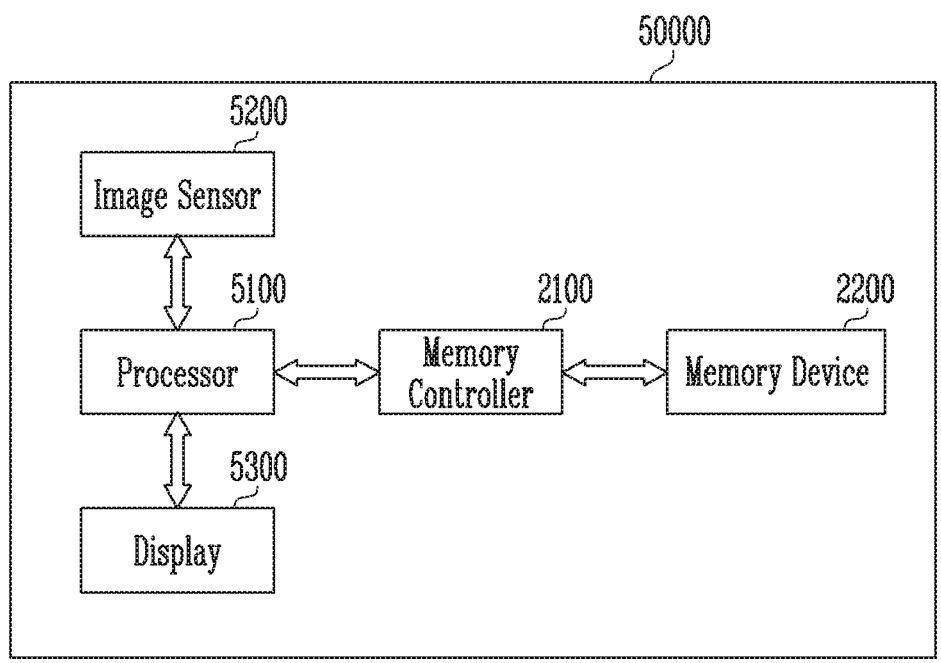

FIG. 15 is a block diagram illustrating another example of a memory system 50000 including the memory device shown in FIG. 3.

Referring to FIG. 15, the memory system 50000 may be implemented as an image processing device, for example, a digital camera, a portable phone provided with a digital camera, a smart phone provided with a digital camera, or a tablet provided with a digital camera.

The memory system 50000 includes the memory device 2200 and the memory controller 2100 capable of controlling a data process operation, for example, a program operation, an erase operation, or a read operation, of the memory device 2200.

An image sensor 5200 of the memory system 50000 may convert an optical image into digital signals. The converted digital signals may be transmitted to a processor 5100 or the memory controller 2100. Under control of the processor 5100, the converted digital signals may be output through a display 5300 or stored in the memory device 2200 through the memory controller 2100. In addition, data stored in the memory device 2200 may be output through the display 5300 under the control of the processor 5100 or the memory controller 2100.

According to an embodiment, the memory controller 2100 capable of controlling the operation of memory device 2200 may be implemented as a part of the processor 5100 or may be implemented as a chip separate from the processor 5100.

Figure 16:
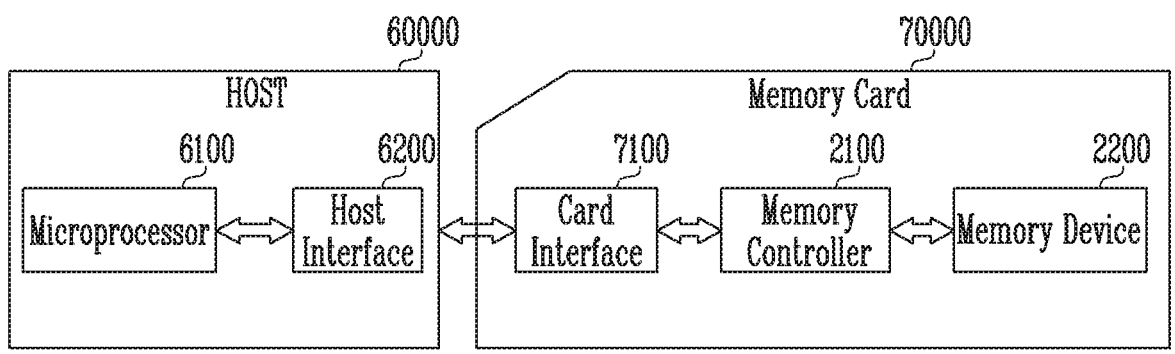

FIG. 16 is a block diagram illustrating another example of a memory system 70000 including the memory device shown in FIG. 3.

Referring to FIG. 16, the memory system 70000 may be implemented as a memory card or a smart card. The memory system 70000 may include the memory device 2200, the memory controller 2100, and a card interface 7100.

The memory controller 2100 may control data exchange between the memory device 2200 and the card interface 7100. According to an embodiment, the card interface 7100 may be a secure digital (SD) card interface or a multi-media card (MMC) interface, but is not limited thereto.

The card interface 7100 may interface data exchange between a host 60000 and the memory controller 2100 according to a protocol of the host 60000. According to an embodiment, the card interface 7100 may support a universal serial bus (USB) protocol, and an interchip (IC)-USB protocol. Here, the card interface 7100 may refer to hardware capable of supporting a protocol that is used by the host 60000, software installed in the hardware, or a signal transmission method.

When the memory system 70000 is connected to a host interface 6200 of the host 60000 such as a PC, a tablet, a digital camera, a digital audio player, a mobile phone, a console video game hardware, or a digital set-top box, the host interface 6200 may perform data communication with the memory device 2200 through the card interface 7100 and the memory controller 2100 under control of a microprocessor 6100.

While the present invention has been described with respect to the specific embodiments, it will be apparent to those skilled in the art that various changes and modifications may be made without departing from the spirit and scope of the invention as defined in the following claims.

What is claimed is:

1. A memory device comprising:
   an address counter configured to generate a plurality of count signals based on a read training enable signal and a first clock signal received from a memory controller; and
   an address section identification signal generator configured to generate address section identification signals used in identifying a plurality of address sections based on at least one of the plurality of count signals.

2. The memory device of claim 1, further comprising:
   a delayed signal generator configured to delay an address latch enable signal received from the memory controller to generate the read training enable signal.

3. The memory device of claim 1, wherein the address counter comprises:
   a counter clock generator configured to generate a second clock signal based on the read training enable signal and the first clock signal; and
   a counter configured to generate the count signals based on the second clock signal.

4. The memory device claim 3, wherein the count signals include:
   first count signals for counting a number of the address sections; and
   second count signals that are inverted signals of the first count signals.

5. The memory device of claim 4, wherein the counter comprises:
   a first count signal generator configured to generate a lower bit count signal corresponding to a lower bit among the first count signals; and
   a second count signal generator configured to generate an upper bit count signal corresponding to an upper bit among the first count signals and an upper bit count inverse signal that is an inverted signal of the upper bit count signal among the second count signals.

6. The memory device of claim 5, wherein the first and second count signal generators include D flip-flops.

7. The memory device of claim 5, wherein the address section identification signal generator generates an inverse flag pattern section identification signal used in identifying a first address section corresponding to an inverse flag pattern, among the plurality of address sections, based on the lower bit count signal and the upper bit count inverse signal.

8. The memory device of claim 7, wherein the inverse flag pattern section identification signal maintains a logic high level when both of the lower bit count signal and the upper bit count inverse signal are a logic high level.

9. The memory device of claim 7, further comprising:
   an inverse flag pattern clock generator configured to generate an inverse flag pattern clock signal used in latching a first address in the first address section, based on the inverse flag pattern section identification signal and the first clock signal.

10. The memory device of claim 9, wherein the inverse flag pattern clock signal has a rising edge at a rising edge of the first clock signal and has a falling edge at a falling edge of the first clock signal during a section in which the inverse flag pattern section identification signal is a logic high level.

11. The memory device of claim 10, further comprising:
    a pattern generator configured to generate the inverse flag pattern by latching the first address at the rising edge of the inverse flag pattern clock signal.

12. The memory device of claim 5, wherein the address section identification signal generator outputs the upper bit count signal as a base pattern section identification signal used in identifying a second address section corresponding to a base pattern, among the plurality of address sections.

13. The memory device of claim 12, further comprising:
    a base pattern clock generator configured to generate a base pattern clock signal used in latching second and third addresses in the second address section, based on the base pattern section identification signal and the first clock signal.

14. The memory device of claim 13, wherein the base pattern clock signal has a rising edge at a rising edge of the first clock signal and has a falling edge at a falling edge of the first clock signal during a section in which the base pattern section identification signal is a logic high level.

15. The memory device of claim 14, further comprising:
    a pattern generator configured to generate the base pattern by latching the second address at a first rising edge of the base pattern clock signal and latching the third address at a second rising edge of the base pattern clock signal.

16. The memory device of claim 1, further comprising:
    a pattern generator configured to generate an inverse flag pattern and a base pattern by using the address section identification signals and the first clock signal.

17. A method of operating a memory device, the method comprising:
    generating a plurality of count signals based on a read training enable signal and a first clock signal received from a memory controller; and
    generating address section identification signals used in identifying a plurality of address sections based on at least one of the plurality of count signals.

18. The method of claim 17, further comprising:
    delaying an address latch enable signal received from the memory controller to generate the read training enable signal.

19. The method of claim 17, wherein generating the plurality of count signals comprises:
    generating a second clock signal based on the read training enable signal and the first clock signal;
    generating a lower bit count signal corresponding to a lower bit among the count signals and an upper bit count signal corresponding to an upper bit among the count signals, based on the second clock signal; and
    generating an upper bit count inverse signal that is an inverted signal of the upper bit count signal among the count signals, based on the second clock signal.

20. The method of claim 19, wherein the generating the address section identification signals comprises:
    generating an inverse flag pattern section identification signal used in identifying a first address section corresponding to an inverse flag pattern, among the plurality of address sections, based on the lower bit count signal and the upper bit count inverse signal.

21. The method of claim 20, wherein the inverse flag pattern section identification signal maintains a logic high level when both of the lower bit count signal and the upper bit count inverse signal are a logic high level.

22. The method of claim 20, further comprising:
generating an inverse flag pattern clock signal used in latching a first address in the first address section, based on the inverse flag pattern section identification signal and the first clock signal.

23. The method of claim 22, wherein the inverse flag pattern clock signal has a rising edge at a rising edge of the first clock signal and has a falling edge at a falling edge of the first clock signal during a section in which the inverse flag pattern section identification signal is a logic high level.

24. The method of claim 23, further comprising:
generating the inverse flag pattern by latching the first address at the rising edge of the inverse flag pattern clock signal.

25. The method of claim 19, further comprising:
generating a base pattern clock signal used in latching second and third addresses in a second address section corresponding to a base pattern, based on the upper bit count signal and the first clock signal.

26. The method of claim 25, wherein the base pattern clock signal has a rising edge at a rising edge of the first clock signal and has a falling edge at a falling edge of the first clock signal during a section in which the upper bit count signal is a logic high level.

27. The method of claim 26, further comprising:
latching the second address at a first rising edge of the base pattern clock signal;
latching the third address at a second rising edge of the base pattern clock signal; and
combining the latched second and third addresses with each other to generate the base pattern.

28. The method of claim 17, further comprising:
generating an inverse flag pattern and a base pattern by using the address section identification signals and the first clock signal.

29. A memory system comprising:
a memory device; and
a controller configured to provide a read training enable signal, a plurality of addresses and a first clock signals to control the memory device to perform a read training operation,
wherein the memory device includes:
an address counter configured to generate a plurality of count signals based on the read training enable signal and the first clock signal; and
an address section identification signal generator configured to generate address section identification signals for identifying a plurality of address sections based on at least one of the plurality of count signals.

30. The memory system of claim 29, wherein the controller controls the memory device to perform a normal operation after the read training operation.

31. The memory system of claim 29, wherein the address counter comprises:
a counter clock generator configured to generate a second clock signal based on the read training enable signal and the first clock signal;
a first count signal generator configured to generate a first signal and a first inverse signal, which have a period twice a period of the second clock signal; and
a second count signal generator configured to generate a second signal and a second inverse signal, which have a period twice a period of the first signal.

32. The memory system of claim 31, wherein the address section identification signal generator comprises:
a first identification signal generator configured to generate a first identification signal for identifying a first address section corresponding to an inverse flag pattern, based on the first signal and the second inverse signal; and
a second identification signal generator configured to generate a second identification signal for identifying a second address section corresponding to a base pattern, based on the second signal.

33. The memory system of claim 32, further comprising:
is a first pattern clock generator configured to generate a first pattern clock signal for latching a first address in the first address section, based on the first identification signal and the first clock signal;
a second pattern clock generator configured to generate a second pattern clock signal for latching second and third addresses in the second address sections, based on the second identification signal and the first clock signal; and
a pattern generator configured to generate the inverse flag pattern and the base pattern according to the first and second pattern clock signals.

* * * * *